United States Patent
Huang et al.

(10) Patent No.: US 6,309,918 B1
(45) Date of Patent: Oct. 30, 2001

(54) MANUFACTURABLE GAAS VFET PROCESS

(75) Inventors: Jenn-Hwa Huang, Gilbert; Benjamin W. Gable, Chandler; Kurt Eisenbeiser, Tempe; David Rhine, Phoenix, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/157,430

(22) Filed: Sep. 21, 1998

(51) Int. Cl.[7] .................................................. H01L 21/338
(52) U.S. Cl. ........................ 438/173; 438/720; 438/742; 438/945
(58) Field of Search .................................. 438/138, 570, 438/173, 176, 186, 192, 135, 136, 137, 268, 270, 576, 571, 167, 720, 742, 945

(56) References Cited

U.S. PATENT DOCUMENTS

| | | | |
|---|---|---|---|
| 4,570,174 | * | 2/1986 | Haung ................................ 357/22 |
| 5,231,037 | * | 7/1993 | Yuan ................................... 437/40 |
| 5,342,795 | * | 8/1994 | Yuan ................................... 437/40 |
| 5,468,661 | * | 11/1995 | Yuan ................................... 437/40 |
| 5,514,604 | * | 5/1996 | Brown ................................ 437/40 |
| 5,610,085 | * | 3/1997 | Yuan ................................... 437/29 |
| 5,712,189 | * | 1/1998 | Plumton ............................ 437/133 |
| 5,808,473 | * | 9/1998 | Shingawa ........................... 324/753 |
| 5,956,578 | * | 9/1999 | Weitzel .............................. 438/138 |
| 5,963,800 | * | 10/1999 | Augusto ............................. 438/212 |
| 6,083,781 | * | 7/2000 | Zopler ................................ 438/167 |
| 6,156,611 | * | 12/2000 | Lan .................................... 438/268 |

* cited by examiner

Primary Examiner—Mary Wilczewski
Assistant Examiner—David Goodwin
(74) Attorney, Agent, or Firm—A. Kate Huffman

(57) ABSTRACT

A manufacturable GaAs VFET process includes providing a doped GaAs substrate with a lightly doped first epitaxial layer thereon and a heavily doped second epitaxial layer positioned on the first epitaxial layer. A temperature tolerant conductive layer is positioned on the second epitaxial layer and patterned to define a plurality of elongated, spaced apart source areas. Using the patterned conductive layer, a plurality of gate trenches are etched into the first epitaxial layer adjacent the source areas. The bottoms of the gate trenches are implanted and activated to form gate areas. A gate contact is deposited in communication with the implanted gate areas, a source contact is deposited in communication with the patterned conductive layer overlying the source areas, and a drain contact is deposited on the rear surface of the substrate.

18 Claims, 4 Drawing Sheets

MANUFACTURABLE GAAS VFET PROCESS

FIELD OF THE INVENTION

The present invention pertains to a process for fabricating GaAs vertical field effect transistors (VFET) and more specifically to a manufacturable GaAs VFET process.

BACKGROUND OF THE INVENTION

In the fabrication of vertical field effect transistors (VFETs) it is common to form gate areas by implanting or otherwise doping a substrate or epitaxial layer on the substrate. The doped areas or implanted areas must then be activated by a relatively high annealing temperature. The annealing temperature is high enough to cause major problems with any ohmic metal that has been previously deposited on the substrate. For example, most of the ohmic metals contain gold and annealing temperatures will cause gold to diffuse into the substrate and produce a very bad ohmic contact.

Thus, in prior art VFETs it is necessary to do all doping and annealing prior to the deposition of ohmic contacts. Any source or gate positioning must be accomplished through very careful alignment, which adds greatly to the cost and substantially reduces reliability. Further, since the deposition of metal contacts is one of the last steps to be performed, no probing of the prior art VFETs can be performed prior to completion. This again adds unduly to the cost, since early difficulties in the process cannot be detected.

It would be highly advantageous to provide a manufacturable GaAs VFET process which overcomes these drawbacks.

It is a purpose of the present invention to provide a new and improved manufacturable GaAs VFET process.

It is another purpose of the present invention to provide a new and improved manufacturable GaAs VFET process which allows the use of ohmic contacts prior to implant and activation steps.

It is still another purpose of the present invention to provide a new and improved manufacturable GaAs VFET process which allows the use of source metal as a self-aligned etch and implant mask.

It is a further purpose of the present invention to provide a new and improved manufacturable GaAs VFET process which allows testing of the VFETs at intermediate points in the process.

SUMMARY OF THE INVENTION

The above problems and others are at least partially solved and the above purposes and others are realized in a manufacturable GaAs VFET process including providing a substrate structure with a doped GaAs supporting substrate, a lightly doped first epitaxial layer including GaAs positioned on a first surface of the supporting substrate, and a heavily doped second epitaxial layer including GaAs positioned on the first epitaxial layer. A temperature tolerant conductive layer is positioned on the second epitaxial layer and patterned to define a plurality of source areas underlying the patterned portions of the conductive layer. The portions of patterned conductive layer are used as a mask and a plurality of gate trenches are etched through the second epitaxial layer and into the first epitaxial layer of the substrate structure adjacent the source areas. The bottoms of the gate trenches are spaced vertically from the second epitaxial layer. Material is implanted in the bottoms of the gate trenches to form implanted gate areas in the gate trenches and the implanted gate areas are activated by annealing. A gate contact is formed in communication with the implanted gate areas, a source contact is formed in communication with the portions of patterned conductive layer overlying the source areas, and a drain contact is formed on the rear surface of the substrate structure.

BRIEF DESCRIPTION OF THE DRAWINGS

Referring to the drawings.

DESCRIPTION OF THE PREFERRED EMBODIMENT

Figure 1:
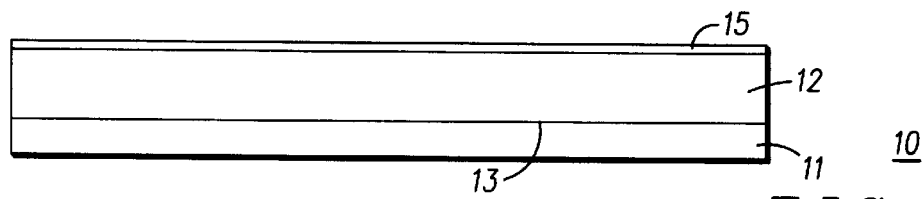
FIG. 1 through FIG. 18 are sectional views illustrating various sequential steps in a manufacturable GaAs VFET process in accordance with the present invention.

Turning now to the drawings in which like characters indicate like parts throughout the various views, FIG. 1 illustrates a substrate structure 10 including a doped GaAs supporting substrate 11, a lightly doped first epitaxial layer 12 positioned on a first surface 13 of supporting substrate 11, and a heavily doped second epitaxial layer 15 positioned on first epitaxial layer 12. It will of course be understood by those skilled in the art that substrate structure 10 could include more or less layers depending upon the specific application. Also, in this specific embodiment, supporting substrate 11 is formed of GaAs which is doped n+, first epitaxial layer 12 is formed of GaAs which is lightly doped n−, and second epitaxial layer 15 is heavily doped n++ In GaAs.

Figure 2:
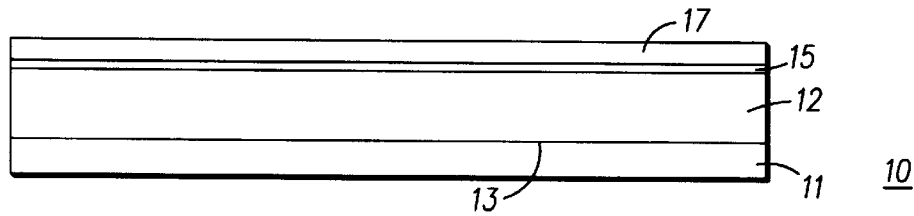

Referring to FIG. 2, a temperature tolerant conductive layer 17 is deposited, generally by sputtering, on second epitaxial layer 15. Layer 17 has a thickness in a range of approximately 2000 Å to approximately 8000 Å. In the specific embodiment where second epitaxial layer 15 is heavily doped n++ In GaAs, due to the narrow band gap of the InGaAs, practically any metal forms a good ohmic contact to second epitaxial layer 15. However, many conductive materials, when deposited on a semiconductor material such as second epitaxial layer 15, will diffuse into the underlying layer during subsequent process steps, such as annealing and other high temperature processes. This mixing of the materials between the layers produces a very poor electrical contact. Consequently, the term "temperature tolerant" for purposes of this disclosure is defined as a material that will withstand all subsequent process steps without degrading (e.g. mixing or diffusing) into adjacent layers. Temperature tolerant conductive layer 17 can include, for example, one or a combination of refractory metals, metal silicides, metal nitrides, metal oxides or the like. In a specific example, temperature tolerant conductive layer 17 includes approximately 3 kÅ of TiW, $WSi_x$, tungsten silicide, or the like with an optional etch mask of 1.5 kÅ of $SiN_x$.

Figure 3:
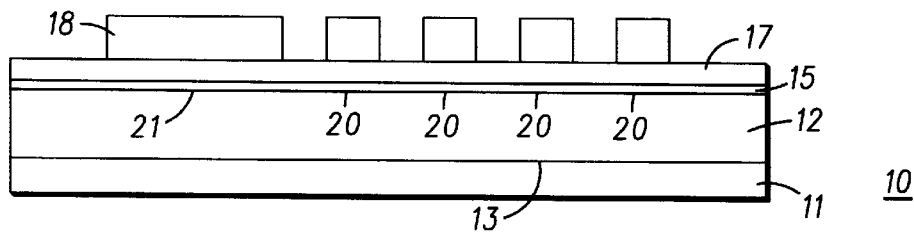
Figure 4:
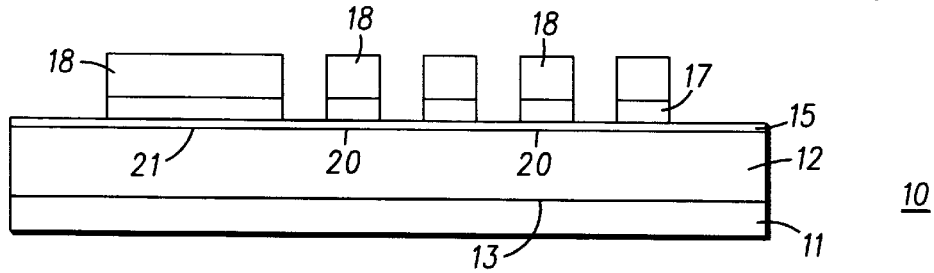
Figure 5:
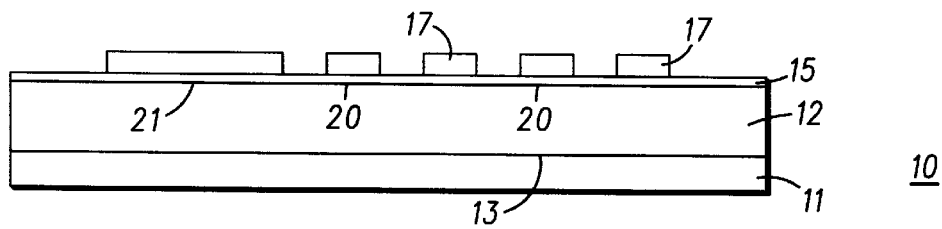

A layer 18 approximately 1 μm thick of photoresist material is deposited on the surface of temperature tolerant conductive layer 17. Layer 18 is patterned to define a plurality of source areas 20, as illustrated in FIG. 3. A larger area is utilized as a termination area 21 between the source and gate terminals, as will be apparent presently. The optional etch mask in temperature tolerant conductive layer 17 aids in preventing damage to the conductive materials during patterning of layer 18 and is used in further processing, as will be described presently. Patterned layer 18 is then used as a mask in the etching of temperature tolerant conductive layer 17, as illustrated in FIG. 4. Specifically, conventional positive stepper lithography can be used to define the areas 20 and 21 and reactive ion etch (RIE) can be used to etch away layer 17 down to second epitaxial layer 15 in the exposed areas. CD measurements of the pattern can be taken during this step to determine the source dimensions and the gate length. Also, the remaining photoresist can be stripped, as illustrated in FIG. 5 or it can optionally be retained for additional protection in the following steps.

Figure 6:
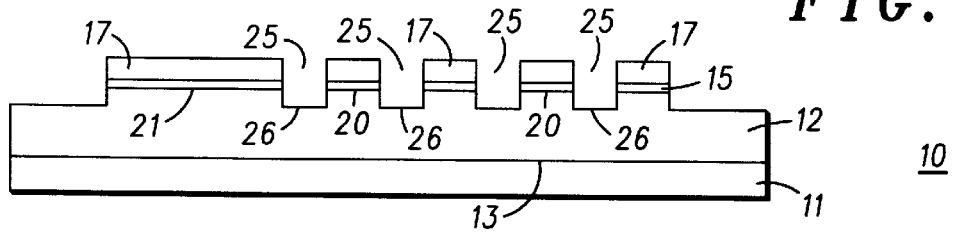

The next step in the process is the etching of substrate structure 10 to form gate trenches 25, illustrated in FIG. 6. Gate trenches 25 extend through second epitaxial layer 15 and into first epitaxial layer 12 to separate second epitaxial layer 15 into source areas 20 positioned beneath and in electrical contact with elongated fingers of temperature tolerant conductive layer 17. Gate trenches 25 extend through second epitaxial layer 15 and into first epitaxial layer 12 sufficiently to prevent shorting between the source and gate, as will be understood presently. Generally, chlorine based etches (e.g. chlorine chemistries such as $BCl_3+Cl_2$, etc.) are used to etch materials in a GaAs material system. In this embodiment, three options exist for etching gate trenches 25. In a first option, the photoresist used to pattern layer 17 (remains of layer 18 illustrated in FIG. 4) can remain as a mask for the etching of gate trenches 25. In a second option a sacrificial etch mask of $SiN_x$ (described above) or other dielectric hard mask is blanket deposited following the temperature tolerant conductive material in layer 17 and patterned simultaneously with the layer 17 photoresist and etch procedure. In a third option, the temperature tolerant conductive material in layer 17 is used directly as an etch mask, given a sufficient etch rate selectivity between layer 17 and layers 15 and 12. Gate trenches 25 are formed with bottoms 26 spaced from second epitaxial layer 15 by substantially vertical sides.

Figure 7:
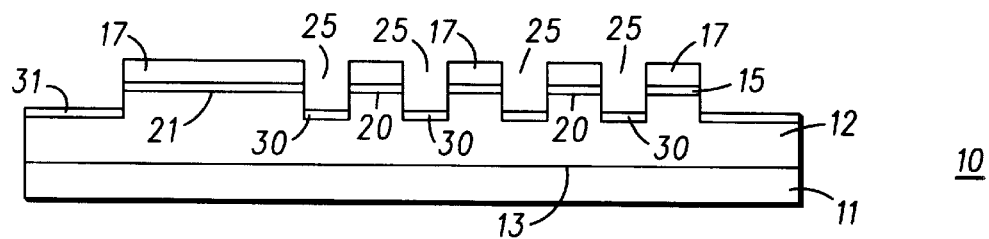

Material is implanted in bottoms 26 of gate trenches 25 to form implanted gate areas 30 in the gate trenches and a gate contact area 31 on an opposite side of termination area 21, as illustrated in FIG. 7. Here it will be understood by those skilled in the art that all of gate trenches 25 are physically and electrically connected together at one or both ends thereof and are further physically and electrically connected to gate contact area 31 by the same means. Generally the same mask that was used to etch first and second epitaxial layers 12 and 15 can be used as a mask during the implantation of gate areas 30. In this specific embodiment, gate areas 30 are p-type conductivity formed by the implantation of argon and carbon ions or other p-type species for GaAs material. The masking layers (whichever option is used) are tailored for the proper thickness to mask any given implant.

Subsequent to the implanting of gate areas 30 and gate contact area 31, a brief sidewall etch is performed on trenches 25 to remove any potential leakage paths. In a specific embodiment, the brief sidewall etch or clean includes an isotropic plasma or wet etch plus the optional removal of any remaining portions of the sacrificial etch mask of $SiN_x$. Here it should be understood that dielectric sidewall spacers (not shown) could be formed before the implant step and removed subsequent to the implant step. After completing the implanting of gate areas 30 and gate contact area 31 and removing any remaining photoresist, the structure is annealed using a temperature cycle which optimizes activation of gate areas 30 and gate contact area 31. In specific applications, some undercutting of source areas 20 could be allowed during the etching of trenches 25 and/or during the brief sidewall etch. A very thin layer of gate metal or other conductive material (incorporated into gate areas 30) is optionally deposited, subsequent to the anneal step, on bottoms 26 of trenches 25 to improve the electrical conductance to gate contact area 31. The undercutting (or dielectric sidewall spacers) ensure that this thin layer will not form leakage paths on the sidewalls of trenches 25 to source areas 20.

Figure 8:
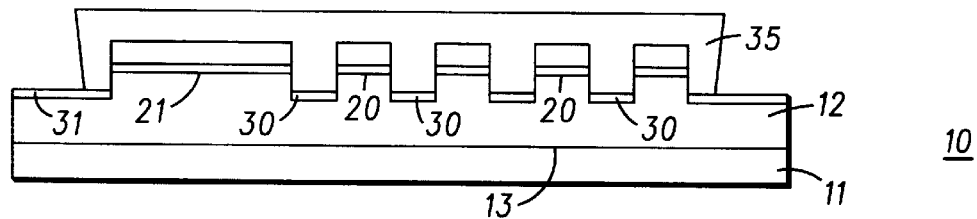
Figure 9:
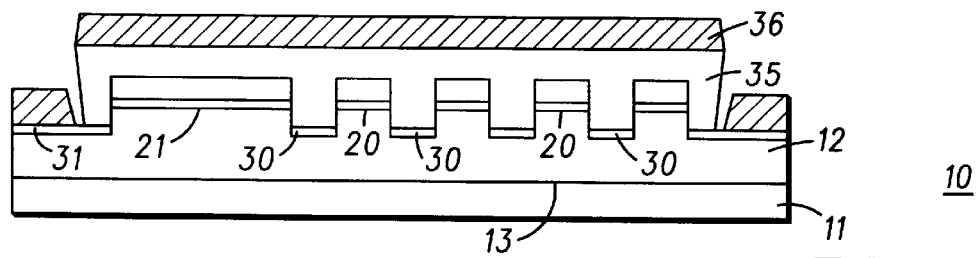
Figure 10:
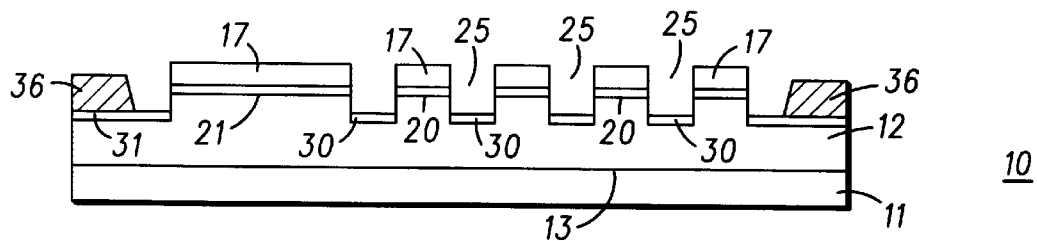

Turning now to FIG. 8, photoresist 35 is deposited on the structure and patterned in any conventional manner to expose gate contact area 31. Ohmic metal 36, which in this specific embodiment is p-type ohmic metal, is deposited by evaporation in a well known manner as illustrated in FIG. 9 so as to contact implanted areas directly. A conventional lift-off technique is then used to remove all unwanted metal, as illustrated in FIG. 10 and a standard ohmic contact alloy is performed.

At this time the device or devices being fabricated can be probed (tested) for several characteristics so that further processing can be terminated in the event of poor or catastrophic characteristics. For example, n and p transmission line model (TLM) measures can be made to determine implant resistivity. Also, gate to source characteristics can be measured and possibly the three terminal functionality of the device or devices can be determined.

Figure 11:
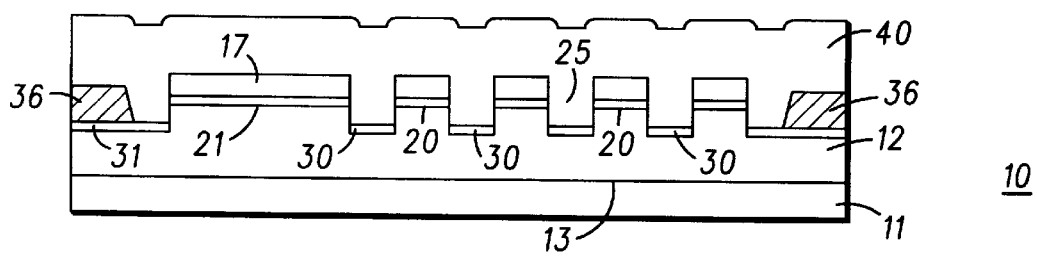
Figure 12:
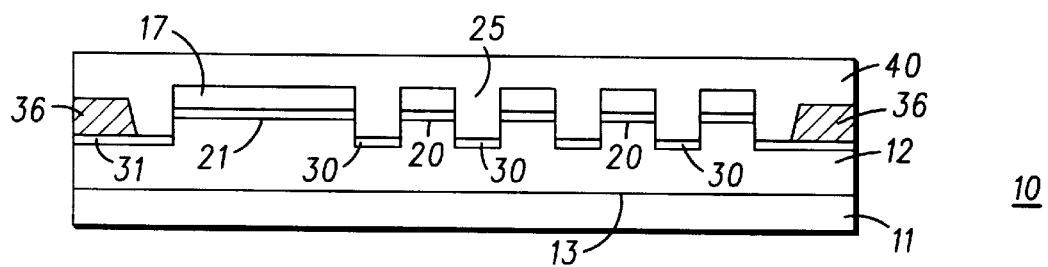
Figure 13:
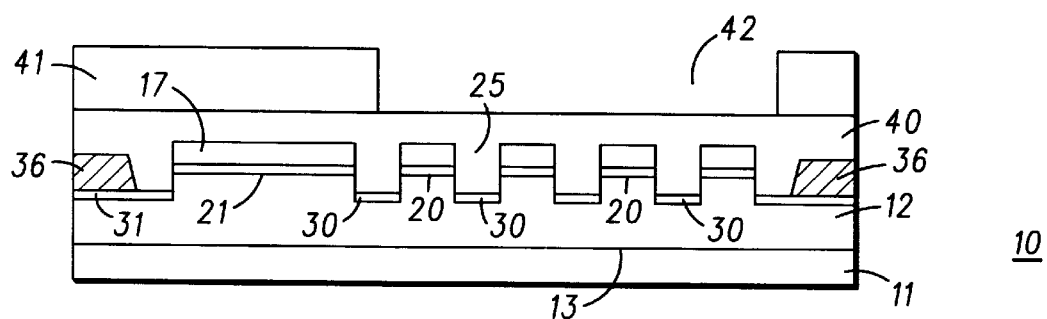
Figure 14:
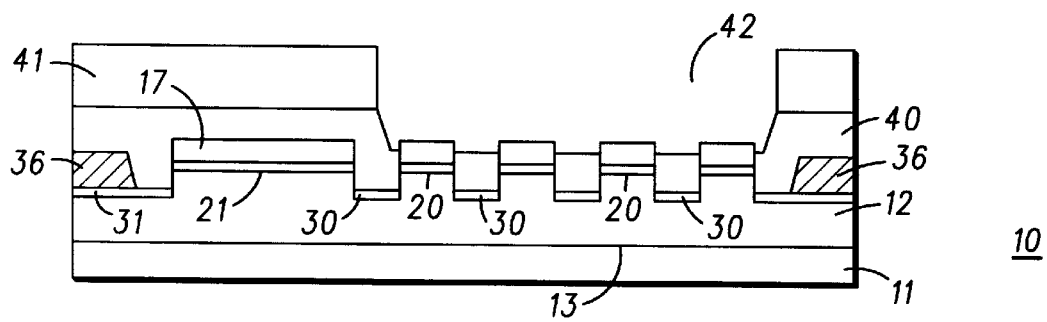

Referring specifically to FIG. 11, a suitable dielectric with good step coverage and planarizing attributes is deposited in a blanket layer 40 over the structure. In the present specific embodiment, tetraethylorthosilicate (TEOS) is used to form blanket layer 40 of $SiO_2$. A top side planarizing process, such as chemical-mechanical polish (CMP), is used to further flatten the surface of blanket layer 40, as illustrated in FIG. 12. The CMP process may be an optional step due to the fact that no subsequent critical dimension lithography operations are required. Planarized blanket layer 40 is then patterned, for example with photoresist etch mask 41, to define a source contact area 42, as illustrated in FIG. 13. The exposed portion or portions of blanket layer 40, e.g. in source contact area 42, are then etched with a convenient isotropic etchant to open the entire area above the elongated fingers of temperature tolerant conductive layer 17 overlying source areas 20, as illustrated in FIG. 14. A selective plasma etch, dielectric to source metal, is used to etch down to the tops of the elongated fingers of temperature tolerant conductive layer 17. In the above example in which TEOS is used to form blanket layer 40, an isotropic $SF_6$ with an optional $SiN_x$ etch is used.

Figure 15:
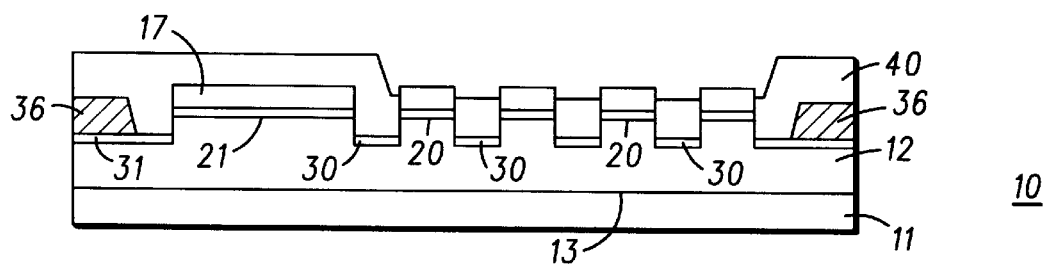
Figure 16:
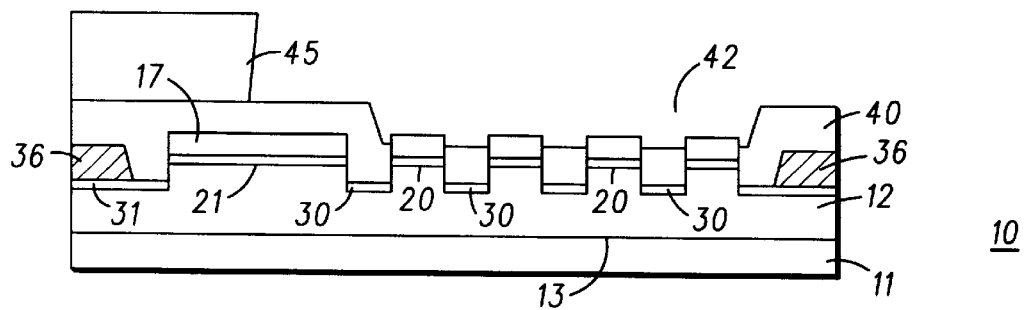
Figure 17:
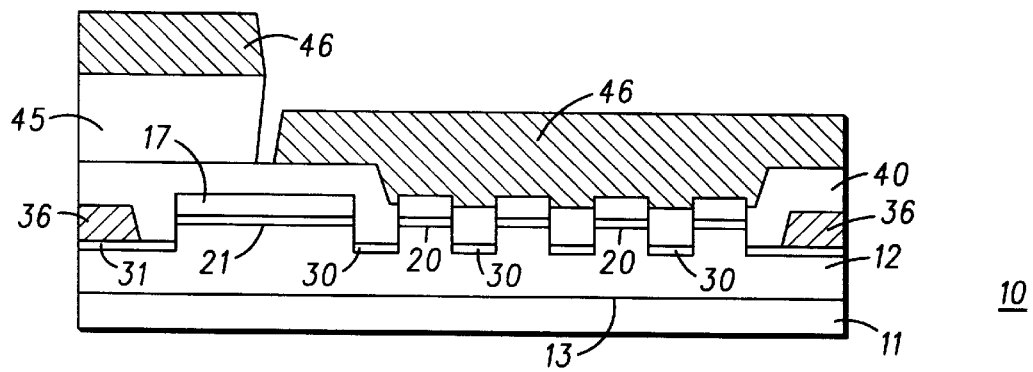
Figure 18:
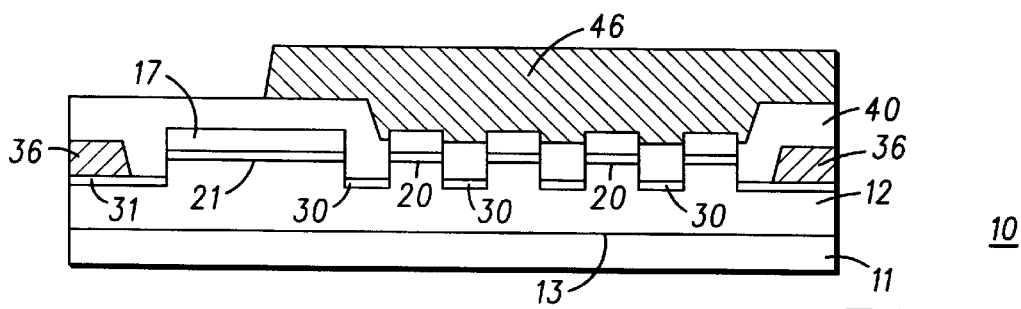
Figure 19:
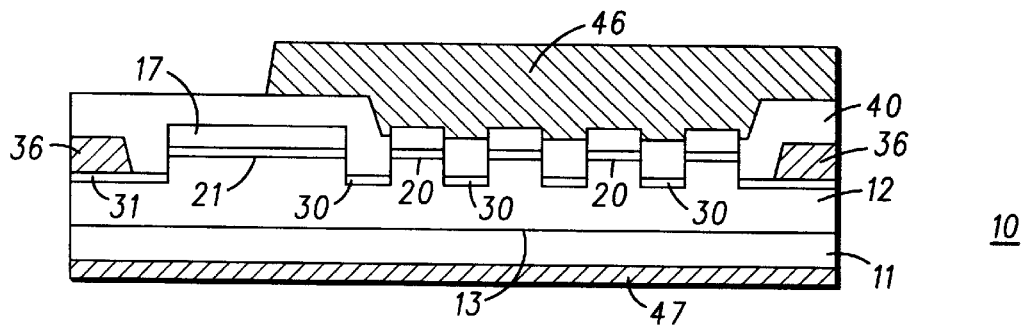
FIG. 19 is a sectional view of a GaAs VFET fabricated in accordance with the process illustrated.

In this specific embodiment, subsequent to etching blanket layer 40, photoresist etch mask 41 is removed, as illustrated in FIG. 15, and a new liftoff photoresist layer 45 is deposited and patterned to redefine source contact area 42 to partially overlie termination area 21, as illustrated in FIG. 16. It should be noted that in some specific applications the steps depicted in FIGS. 14–16 may be combined into a single photolithography step, using a photoresist profile suitable for liftoff as the etch mask. Bond pad metal 46, e.g. Ti/Au or the like, is then selectively evaporated onto the elongated fingers of temperature tolerant conductive layer 17 using conventional liftoff lithography, as illustrated in FIGS. 17 and 18. Bond pad metal 46 should be deposited thick enough for wire bonding in most applications. Supporting substrate 11 can then be thinned, by any conventional wafer thinning technique, to approximately 4 mils and a drain contact 47 is deposited, by evaporation, sputtering, or the like on a rear surface of the substrate structure 10. Drain contact 47, in this embodiment, is n-type metal such as NiGeAu alloy, or the like. FIG. 19 illustrates a sectional view of a final VFET structure in accordance with the present invention.

Thus, a manufacturable GaAs VFET process which overcomes the drawbacks of prior art processes has been disclosed. The new and improved manufacturable GaAs VFET process allows the use of ohmic contacts prior to implant and activation steps as well as the use of source metal as a self-aligned etch and implant mask. Further, because of the early formation of source and gate conductive areas, the new and improved manufacturable GaAs VFET process allows testing of the VFETs at intermediate points in the process, which can greatly reduce unnecessary process costs. More specifically, the robust ohmic contacts using refractory metal or the like allows for subsequent high temperature processes, such as implant activation. Because of the early incorporation of the ohmic contacts, gate trenches can be self-aligned to the source metal contacts using the source metal as the etch mask (since chlorine etch is used for GaAs trench etch while fluorine is used for refractory ohmic metal etch). Because of this self-aligned feature, deep submicron source contacts become possible with the present process, since it is almost impossible to align accurately and consistently deep submicron vias over submicron size source contacts. The deep submicron source contacts enables very low voltage operation for GaAs VFETs. Further, controlled undercuts in the gate trenches are possible so that a thin layer of ohmic metal can be deposited over the gate implants to substantially reduce gate resistance.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A manufacturable GaAs VFET process comprising the steps of:

providing a substrate structure including a doped GaAs supporting substrate, a lightly doped first epitaxial layer including GaAs positioned on a first surface of the supporting substrate, and a heavily doped second epitaxial layer including GaAs positioned on the first epitaxial layer;

depositing a temperature tolerant conductive layer on the second epitaxial layer;

patterning the conductive layer to define a plurality of source areas underlying portions of patterned conductive layer;

using the portions of patterned conductive layer, etching a plurality of gate trenches into the first epitaxial layer of the substrate structure adjacent the source areas, the gate trenches having bottoms spaced vertically from the second epitaxial layer;

implanting material in the bottoms of the gate trenches to form implanted gate areas in the gate trenches and activating the implanted gate areas;

depositing a gate contact in communication with the implanted gate areas by depositing a thin metal layer on the implanted gate areas to reduce gate resistance wherein the step of etching the plurality of gate trenches included undercutting the portions of patterned conductive layer to prevent metal from being deposited on trench sides during the step of depositing the thin metal layer on the implanted gate areas;

depositing a source contact in communication with the portions of patterned conductive layer overlying the source areas; and depositing a drain contact on a second surface of the substrate structure.

2. A manufacturable GaAs VFET process as claimed in claim 1 wherein the step of providing the substrate structure includes providing a supporting substrate of N+ GaAs, a first epitaxial layer of N− GaAs, and a second epitaxial layer of N++ InGaAs.

3. A manufacturable GaAs VFET process as claimed in claim 2 wherein the step of implanting material in the bottoms of the gate trenches includes implanting one of argon and carbon ions to form p conductivity implanted gate areas.

4. A manufacturable GaAs VFET process as claimed in claim 1 wherein the step of depositing the temperature tolerant conductive layer includes depositing a layer of conductive material which remains a layer during activation of the implanted gate areas.

5. A manufacturable GaAs VFET process as claimed in claim 4 wherein the step of depositing the layer of conductive material includes depositing one of a refractory metal, a metal silicide, a metal nitride, and a metal oxide.

6. A manufacturable GaAs VFET process as claimed in claim 1 wherein the step of patterning the conductive layer to define the plurality of source areas includes forming a pattern of photoresist on the layer of conductive material defining the source areas, and etching the layer of conductive material using the layer of photoresist as a mask to form the source areas.

7. A manufacturable GaAs VFET process as claimed in claim 1 wherein the step of etching the layer of conductive material includes reactive ion etching the conductive layer.

8. A manufacturable GaAs VFET process as claimed in claim 1 wherein the step of etching the plurality of gate trenches includes using a GaAs etch including chlorine chemistry to etch the substrate structure.

9. A manufacturable GaAs VFET process as claimed in claim 1 wherein the step of providing the substrate structure includes providing a substrate structure having a first conductivity and the step of implanting material in the bottoms of the gate trenches to form implanted gate areas includes forming implanted gate areas of a second conductivity opposite to the first conductivity.

10. A manufacturable GaAs VFET process as claimed in claim 1 including in addition a step of probing the VFET to determine implant resistivity and gate-to-source leakage subsequent to the step of depositing the gate contact.

11. A manufacturable GaAs VFET process as claimed in claim 1 wherein the step of depositing the gate contact includes depositing ohmic metal on an implanted area in communication with and remote from the implanted gate areas in the bottoms of the gate trenches.

12. A manufacturable GaAs VFET process as claimed in claim 1 wherein the step of depositing the source contact in communication with the portions of patterned conductive layer overlying the source areas includes filing the gate trenches with an insulating material so as to leave the portions of patterned conductive layer overlying the source areas exposed, and depositing a layer of source contact metal over the insulating material and in electrical contact with the portions of patterned conductive layer.

13. A manufacturable GaAs VFET process comprising the steps of:

providing a substrate structure including a doped GaAs supporting substrate, a lightly doped first epitaxial layer including GaAs positioned on a first surface of the supporting substrate, and a heavily doped second epitaxial layer including GaAs positioned on the first epitaxial layer;

depositing a temperature tolerant conductive layer on the second epitaxial layer where the temperature tolerance is such that the layer of conductive material remains a layer during annealing for activation of implanted areas;

pattering the conductive layer to define a plurality of spaced apart, elongated source areas underlying portions of patterned conductive layer;

using the portions of patterned conductive layer, etching a plurality of gate trenches into the first epitaxial layer of the substrate structure adjacent the source areas so as to form elongated raised fingers between the gate trenches with the elongated source areas underlying portions of patterned conductive layer on an upper surface of the raised fingers, the gate trenches having bottoms spaced vertically from the second epitaxial layer, and the plurality of gate trenches being interconnected;

implanting material in the first epitaxial layer at the bottoms of the gate trenches to form implanted gate areas in the gate trenches;

annealing to activate the implanted gate areas;

depositing a gate contact in communication with the implanted gate areas by depositing a thin metal layer on the implanted gate areas to reduce gate resistance wherein the step of etching the plurality of gate trenches included undercutting the portions of patterned conductive layer to prevent metal from being deposited on trench sides during the step of depositing the thin metal layer on the implanted gate areas;

depositing a source contact in communication with the portions of patterned conductive layer overlying the source areas; and depositing a drain contact on a second surface of the substrate structure.

14. A manufacturable GaAs VFET process as claimed in claim 13 wherein the step of providing the substrate structure includes providing a supporting substrate of N+ GaAs, a first epitaxial layer of N− GaAs, and a second epitaxial layer of N++ InGaAs.

15. A manufacturable GaAs VFET process as claimed in claim 14 wherein the step of implanting material in the bottoms of the gate trenches includes implanting one of argon and carbon ions to form p conductivity implanted gate areas.

16. A manufacturable GaAs VFET process as claimed in claim 13 wherein the step of depositing the layer of temperature tolerant conductive material includes depositing one of a refractory metal, a metal silicide, a metal nitride, and a metal oxide.

17. A manufacturable GaAs VFET process as claimed in claim 13 wherein the step of etching the plurality of gate trenches includes using a GaAs etch including chlorine chemistry to etch the substrate structure.

18. A manufacturable GaAs VFET process as claimed in claim 13 including in addition a step of probing the VFET to determine implant resistivity and gate-to-source leakage subsequent to the step of depositing the gate contact.

* * * * *